United States Patent [19]
Fujisaki et al.

[11] Patent Number: 5,894,853
[45] Date of Patent: Apr. 20, 1999

[54] CLEANING METHOD FOR REMOVAL OF CONTAMINANTS

[75] Inventors: Tatsuo Fujisaki, Nara; Koji Tsuzuki, Kyoto; Takeshi Takada, Kyoto; Yoshifumi Takeyama, Kyoto, all of Japan

[73] Assignee: Canon Kabushiki Kaisha, Tokyo, Japan

[21] Appl. No.: 08/979,330

[22] Filed: Nov. 26, 1997

Related U.S. Application Data

[63] Continuation of application No. 08/499,551, Jul. 7, 1995, abandoned.

[30] Foreign Application Priority Data

Jul. 6, 1994 [JP] Japan .................. 6-154442
Jun. 22, 1995 [JP] Japan .................. 7-156545

[51] Int. Cl.$^6$ .................. B08B 3/04; C23G 5/00
[52] U.S. Cl. .................. 134/26; 134/10; 134/2; 134/38; 134/40
[58] Field of Search .................. 134/10, 26, 38, 134/40, 2

[56] References Cited

U.S. PATENT DOCUMENTS

| | | | |
|---|---|---|---|
| 4,654,089 | 3/1987 | Singelyn et al. | 134/26 |
| 4,861,385 | 8/1989 | Yagishita | 134/10 |
| 4,997,490 | 3/1991 | Vetter et al. | 134/26 |
| 5,089,084 | 2/1992 | Chhabra et al. | 156/646 |
| 5,314,780 | 5/1994 | Takei et al. | 430/128 |

*Primary Examiner*—Zeinab El-Arini
*Attorney, Agent, or Firm*—Fitzpatrick, Cella, Harper & Scinto

[57] ABSTRACT

A cleaning method whereby a cleaning liquid used for cleaning in one cleaning stage is mixed after the one cleaning stage with a cleaning liquid used for cleaning in a rear cleaning stage. The flow rate of the one cleaning stage being greater than that of the cleaning liquid used for cleaning in the rear cleaning stage.

18 Claims, 11 Drawing Sheets

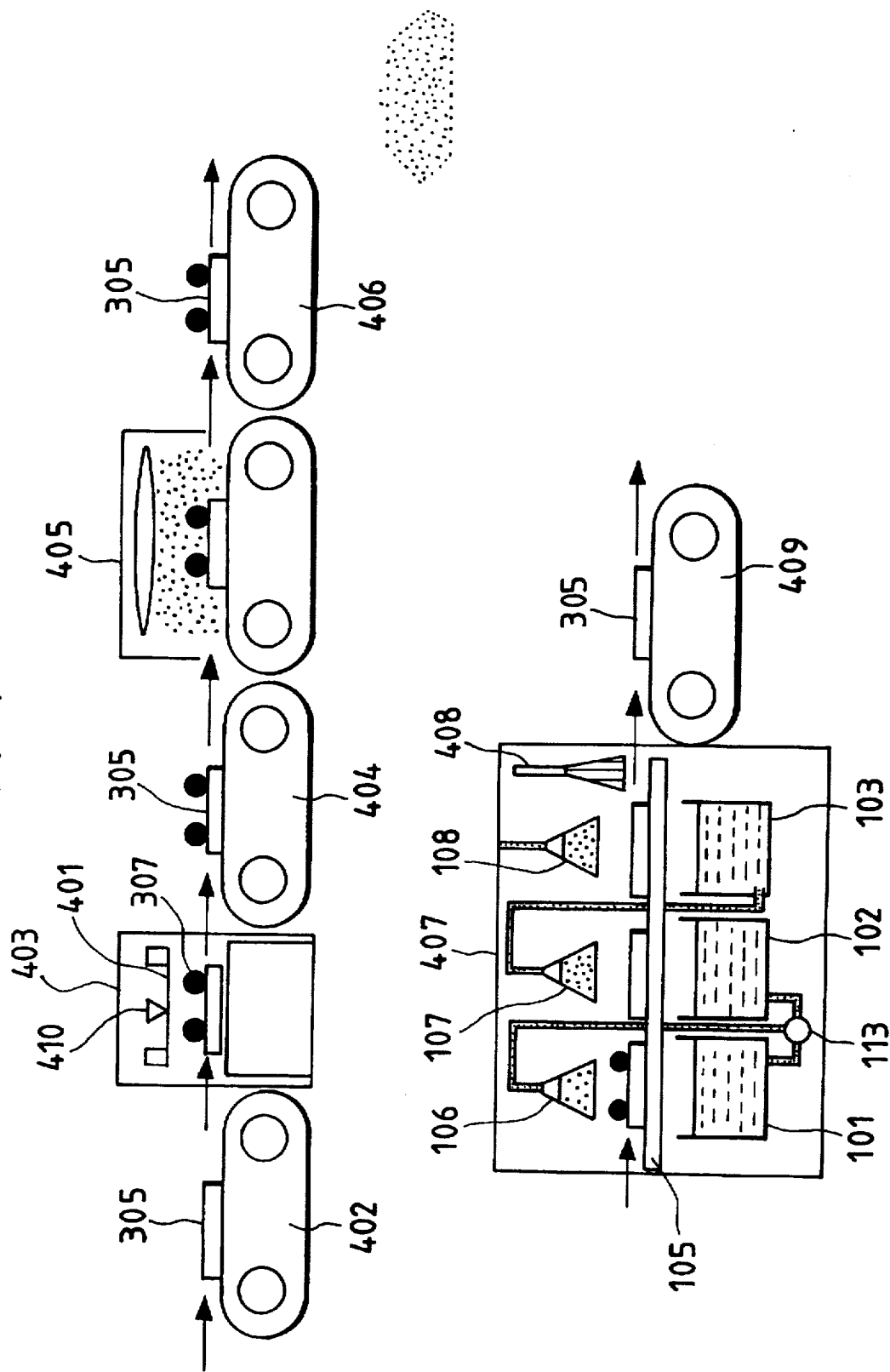

CLEANING METHOD FOR REMOVAL OF CONTAMINANTS

This application is a continuation of application Ser. No. 08/499,551, filed Jul. 7, 1995, now abandoned.

BACKGROUND OF THE INVENTION

1. Field of the Invention

The present invention relates to a cleaning apparatus and a cleaning method, and more specifically to a cleaning apparatus and a cleaning method which can remove contaminants deposited on a treated body such as a substrate, particularly which can efficiently remove contaminants by efficient use of cleaning water.

2. Related Background Art

Semiconductor devices such as photovoltaic devices are generally apt to be damaged when polluted, and therefore, production procedures therefor must be arranged not only to prevent small dust particles or ion components, which are some types of pollutants, from adhering to the devices, but also to remove them to the utmost if necessary.

However, indiscriminately using a lot of cleaning water in order to obtain clean substrates or treated surfaces will result in increasing the cost of cleaning water, enlarging waste water treatment facilities, and increasing the treatment cost, which will in turn increase the fabrication cost.

On the other hand, and attempt to clean the devices with a small amount of cleaning water would result in insufficient removal of the above dust particles or ion components, thus raising possibilities of causing defects, which were not expected originally, and lowering long-term reliability due to unremovable ion components.

A variety of ideas have been presented heretofore to meet the above conflicting demands.

For example, there are generally used cleaning apparatuses, as shown in FIG. 1, having cleaning baths of the so-called cascade type provided with a plurality of cleaning zones and arranged to use a liquid already used for cleaning in a rear stage, for cleaning in a front stage.

In FIG. 1, reference numerals 901, 902, 903 designate first, second, and third cleaning liquid baths. A new cleaning liquid 904 is supplied through a supply pipe 904 to pour down through a shower 905 above the third cleaning liquid bath 903, then to clean a surface of substrate 907 as a treated body, and thereafter to be collected in the cleaning liquid bath 903 (as a primary treatment liquid 908). During this period, the substrate 907 mounted on a carry conveyor 906 is carried to the right on the plane of the drawing. Namely, the new cleaning liquid supplied through the supply pipe 904 is used for finish cleaning. The primary treatment liquid 908 collected in the third cleaning liquid bath 903 is fed by a pump 909 through a pipe 911, one end of which is connected to the third cleaning liquid bath 903, to a shower 910 installed above the second cleaning liquid bath 902, which is a front-stage cleaning bath. Thus, the substrate 907 is cleaned with the cleaning liquid before the aforementioned treatment.

The cleaning liquid used for cleaning herein and including contaminants is collected as a secondary treatment liquid 912 in the second cleaning liquid bath 902.

In the cleaning apparatus shown in FIG. 1, the secondary treatment liquid 912 in the second cleaning liquid bath 902 is fed by a pump 914 through a pipe 913 to a shower 915, whereby the substrate 907 is cleaned with the secondary treatment liquid 912. The cleaning liquid after cleaning (tertiary treatment liquid 916) is collected in the first cleaning liquid bath 901 to be disposed of.

Observing the treatment with respect to the substrate, it is arranged to transfer the substrate from cleaning with the cleaning liquid of a high degree of pollution to cleaning with cleaning liquids of gradually increasing cleanliness, thus being designed to achieve high cleaning effects with a relatively small amount of cleaning liquid.

It is apparent in this case that if the cleaning liquid is supplied at V l/min to the final-stage cleaning liquid bath, shower rates at the first, second, and third cleaning liquid baths, then a waste rate from the first cleaning liquid bath is also substantially V l/min.

For the above-stated cleaning method to achieve the intended purpose, it is, however, necessary that contaminants on the substrate quickly diffuse into the cleaning liquid with jet spray of the cleaning liquid.

There are cases where satisfactory cleaning cannot be made by the previously described method if the contaminants on the substrate are sticky or are layered in some thickness or if the contaminants are unlikely to diffuse into the cleaning liquid.

For throughly removing the contaminants of the above-mentioned types, there are methods to use a lot of cleaning liquid for cleaning at the position corresponding to the first cleaning liquid bath 901 where the substrate is first cleaned.

A first method among them is one to increase an amount of the cleaning liquid for the cleaning treatment corresponding to the first cleaning liquid bath 901, that is, to add a new cleaning liquid (for example, at a using rate V') to the cleaning liquid used for the cleaning treatment corresponding to the first cleaning liquid bath 901. A second method is one to increase the using rate V of the entire cleaning liquid. Either of the two methods inevitably increases the total amount of the cleaning liquid necessary for cleaning. This increase of the amount of cleaning liquid will result in not only increasing the supply demand of pure water or the like and increasing the production cost, but also increasing the demand of disposal facilities, increasing the disposal cost, and increasing feed capacity (pump demand etc.) of cleaning liquid. As a result, the cost for an apparatus increases, which could affect the product cost of devices.

SUMMARY OF THE INVENTION

The present invention has been accomplished taking account of the above points, and an object of the present invention is to provide a cleaning apparatus and a cleaning method that can perform superior cleaning with usage of a smaller amount of cleaning water (cleaning liquid), regardless of whether or not the contaminants deposited on the substrate have a high viscosity for example.

Another object of the present invention is to provide a cleaning apparatus and a cleaning method improved in cleaning performance without increasing the cost for apparatus.

An additional object of the present invention is to provide a cleaning apparatus and a cleaning method which are free of an increase of a disposal amount of waste water and an increase of the disposal cost of waste water.

An object of the present invention is to provide a cleaning apparatus having:

- a plurality of cleaning stages for cleaning a body to be treated,
- a plurality of storage portions for storing respective cleaning liquids as used in each of the plurality of cleaning stages, and a passage for supplying a cleaning liquid in a storage portion corresponding to one cleaning stage out of two adjacent cleaning stages of the plurality of cleaning stages and a cleaning liquid in a storage portion corresponding to an adjacent cleaning stage to the one cleaning stage.

An object of the present invention is to provide a cleaning method for successively cleaning a body to be treated in a plurality of cleaning stages, comprising the steps of:

mixing a cleaning liquid used for cleaning in one cleaning stage with a cleaning liquid used for cleaning in a rear cleaning stage after the one cleaning stage and cleaning the body to be treated with the cleaning liquid at a greater flow rate than that of the cleaning liquid used for cleaning in the rear cleaning stage.

BRIEF DESCRIPTION OF THE DRAWINGS

FIG. 4A to FIG. 4C are drawings to illustrate preferred examples of shower heads, wherein FIG. 4A and FIG. 4B are diagrammatic perspective views and FIG. 4C a diagrammatic cross section;

FIG. 13 is a diagrammatic structural drawing to illustrate a preferred example of a producing apparatus used on the way of producing the solar cell.

DESCRIPTION OF THE PREFERRED EMBODIMENTS

The present invention will be described by reference to the drawings.

Figure 2:
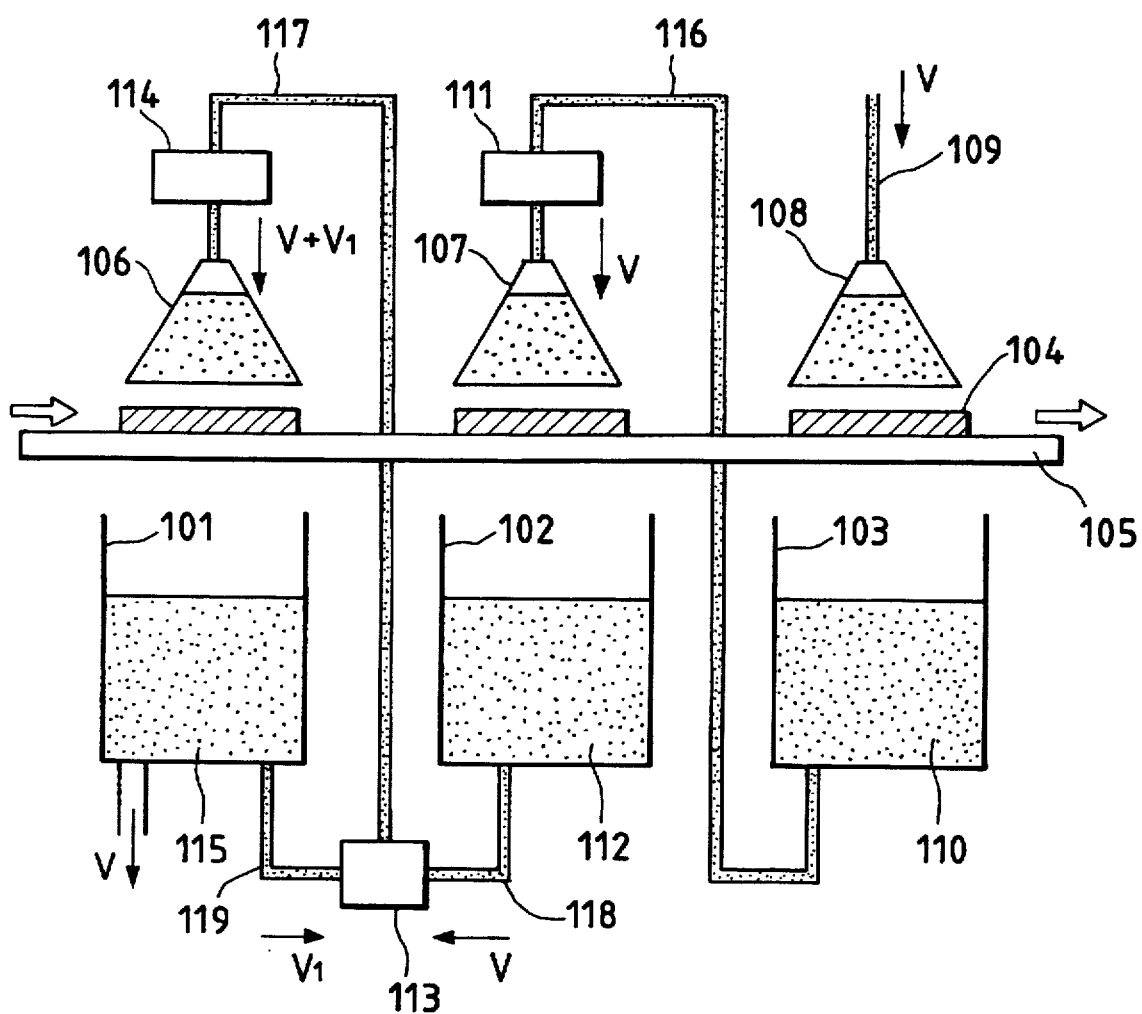
FIG. 2 is a diagrammatic structural drawing to illustrate a preferred example of the cleaning apparatus of the present invention.

FIG. 2 is a diagrammatic structural drawing to illustrate the structure of the cleaning apparatus of the present invention. In FIG. 2, reference numerals 101, 102, 103 designate a first cleaning liquid bath, a second cleaning liquid bath, and a third cleaning liquid bath, respectively; 104 a substrate as a treated body subjected to cleaning; 105 a belt as carrying means for carrying the substrate 104; 106, 107, 108 shower heads for discharging or spraying respective cleaning liquids supplied thereto toward the substrate 104; 109, 116, 117, 118, 119 pipes for supplying respective cleaning liquids; 111, 114 pumps for feeding the respective cleaning liquids; 113 a converging device; and 110, 112, 115 a first treatment liquid, a second treatment liquid, and a third treatment liquid, respectively.

Also in the cleaning apparatus shown in FIG. 2, the substrate 104 is successively carried from left to right in the drawing and is finally cleaned with a new cleaning water. A significant difference of the cleaning apparatus shown in FIG. 2 from the cleaning apparatus as described with FIG. 1 resides in the following point.

Figure 1:
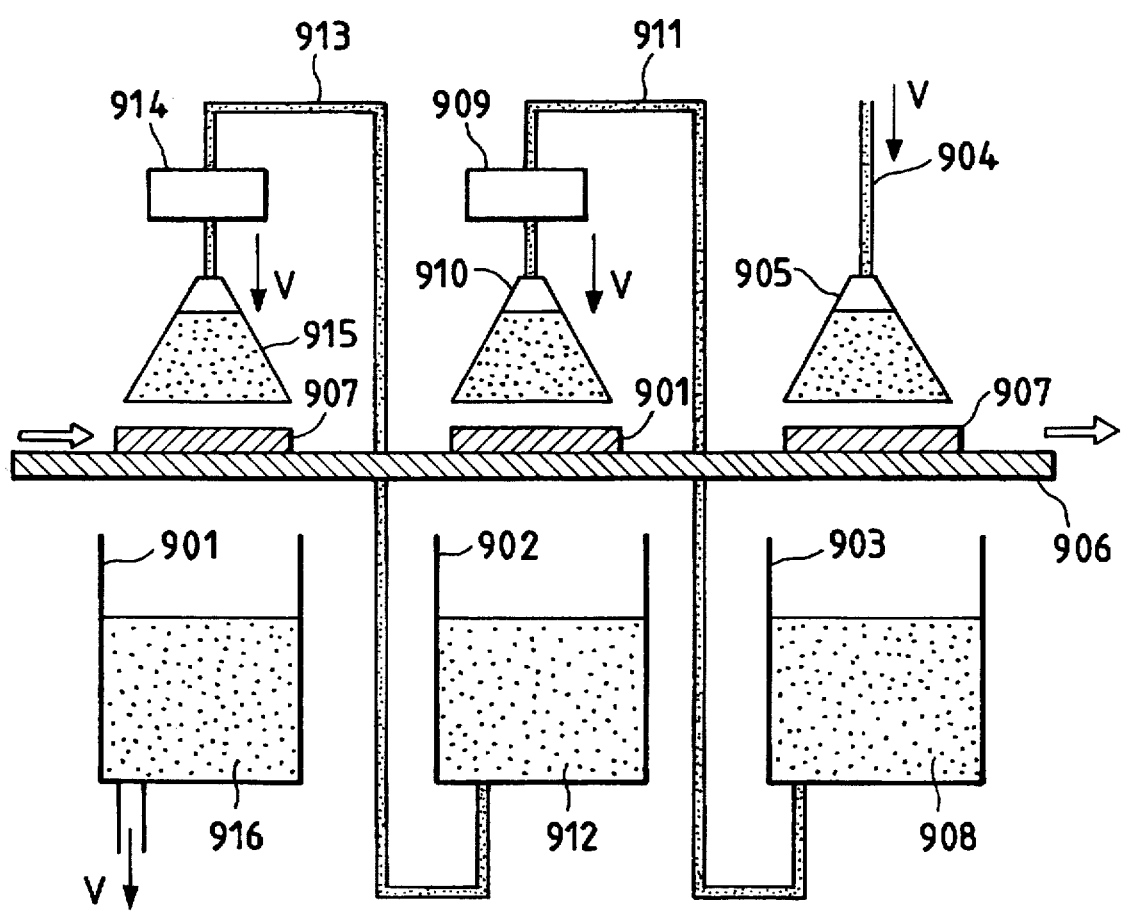
FIG. 1 is a diagrammatic structural drawing to illustrate a conventional cleaning apparatus.

In case of the cleaning apparatus shown in FIG. 2, flows of the cleaning liquids are greatly different from those in the cleaning apparatus shown in FIG. 1.

A new cleaning liquid is supplied through the pipe 109 to the shower head 108 to be jet-sprayed through the shower head 108 toward the substrate 104 so as to clean the substrate 104. The cleaning liquid after cleaning of substrate 104 is stored as the primary treatment liquid 110 in the third cleaning liquid bath 103, and this primary treatment liquid 110 is fed through the pipe 116, one end of which is connected to the third cleaning liquid bath 103, to the shower head 107 by the pump 111 and is then jet-sprayed through the shower head 107 toward the substrate 104 to clean the substrate 104. After cleaning the substrate 104, the primary treatment liquid 110 is stored as the secondary treatment liquid 112 in the second cleaning liquid bath 102. The arrangement up to this point is the same as that in the cleaning apparatus described with FIG. 1.

Next, the secondary treatment liquid 112 is fed through the pipe 118, connected to the second cleaning liquid bath 102, past the converging device 113, and through the pipe 117 to the shower head 106 by the pump 114. The cleaning liquid supplied to the shower head 106 is jet-sprayed through the shower head 106 toward the substrate 104 to clean the substrate 104. After cleaning the substrate 104, the cleaning liquid is stored as the tertiary treatment liquid 115 in the first cleaning liquid bath 101.

The pipe 119 is connected to the first cleaning liquid bath 101, which enables the tertiary treatment liquid 115 stored in the first cleaning liquid bath 101 to be supplied through the converging device 113 to the pipe 117.

Namely, in the case of this drawing, the cleaning liquid supplied to the shower head 106 by the pump 114 is a mixture of the secondary treatment liquid 112 used to clean the substrate 104 twice with the tertiary treatment liquid 115 used to clean the substrates 104 three or more times.

Such an arrangement enables the substrate 104 to be cleaned with the cleaning liquid jet-sprayed through the shower head 106 at a rate greater than the supply rate (V 1/min) of the newly supplied cleaning liquid.

The capability of jet-spraying a greater amount of the cleaning liquid per unit time results in increasing an amount of the cleaning liquid per unit area, whereby the substrate can be cleaned more evenly and pollutants can be washed out under a higher pressure.

Also, this apparatus requires simply increasing the capacity only of the final-stage pump 114, but does not always have to increase the performance of the all other pumps, thus realizing a lower cost cleaning apparatus.

Figure 3A:
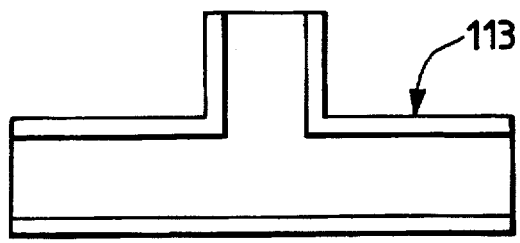
FIG. 3A to FIG. 3C are diagrammatic cross sections to illustrate preferred examples of converging device.

A simplest structure of the converging device 113 is a structure having openings allowing three-way communications of the cleaning liquid and opening to one space, for example a three way joint as shown in FIG. 3A, or a structure obtained by perforating a midway part of one pipe and connecting another pipe thereto.

Figure 3B:
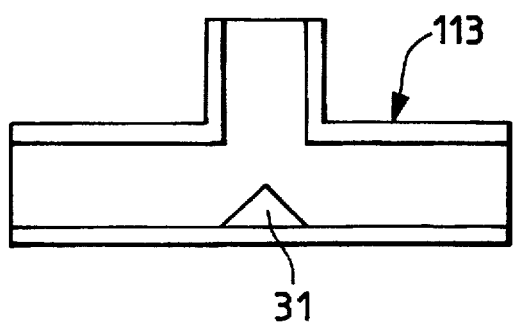
Figure 3C:
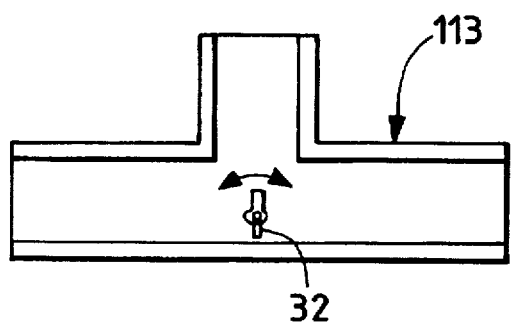

Of course, taking into consideration the cases where pipe resistances of the pipe 118 and pipe 119 or pressures on the cleaning liquids in these pipes are different from each other or the cases where a mixture ratio between the secondary treatment liquid and the tertiary treatment liquid is desired to change, the converging device 113 may be constructed in the structure shown in FIG. 3B or the structure as shown in FIG. 3C.

In FIG. 3B, a projection 31 is provided in a flow path to form a flow resistance, thereby making the flow of liquid or pipe resistance controllable. For example, the controllability can be achieved by properly determining a projecting amount of the projection or angles of slant faces of the projection, differentiating an angle of left slope from an angle of right slope, or shifting the position of the projection horizontally.

FIG. 3C shows an arrangement with a valve 32, in which the controllability is similarly realized by adjusting the position of the valve or an angle (rotation angle) of the valve.

In case of the arrangement as shown in FIG. 2 where the cleaning liquid as the mixture of the secondary treatment liquid and the tertiary treatment liquid is fed by the pump, the simple structure as described above can be employed as the structure of the converging device without any practical problem. If it is necessary to prevent unprepared mixture of the secondary treatment liquid with the tertiary treatment liquid, a check valve is desirably provided on the way of the flow path, for example on the way of the pipes 118, 119.

FIG. 2 shows an example in which one pump 114 supplies the cleaning liquid to the shower head 106 in a greater amount than an amount of the new cleaning liquid, but the pipe 118 and pipe 119 may be provided with respective pumps. In this case, the capacity of each pump can be made smaller, which enables the cleaning apparatus to be designed in a smaller scale. Also, the mixture ratio between the secondary treatment liquid and the tertiary treatment liquid can be adjusted by adjusting driving forces of the pumps, that is, discharge amounts of cleaning liquid.

Of course, the converging device 113 is by no means limited to the above-mentioned structures, but may take a variety of forms. Instead of the structures having the three way openings as described above, the joint apparatus may be constructed in such a structure that a storage portion is provided as a separate part for storing the mixture of the treatment liquids and the mixture is supplied from the storage portion through a pipe to the shower head 106.

Figure 4A:
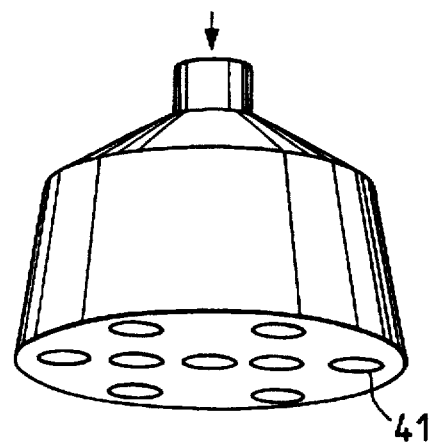
Figure 4B:
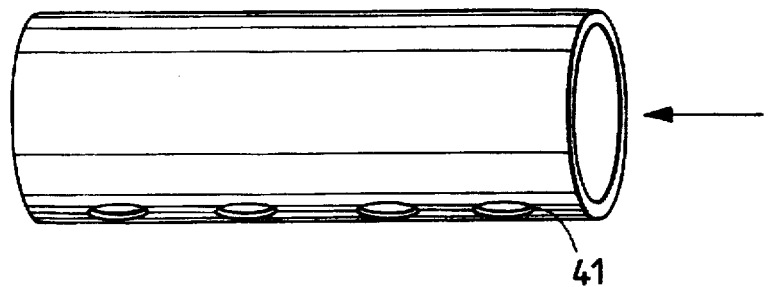
Figure 4C:
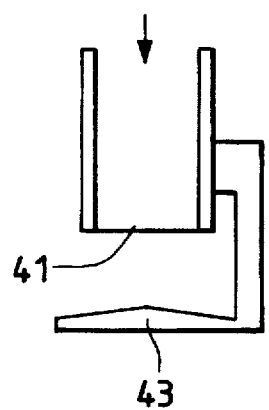

There are no restrictions on the shape, the number of holes, the size, and the layout of the shower heads for jet-spraying the cleaning liquid as long as they can jet-spray the cleaning liquid toward the treated body (substrate) with efficiency. Thus preferred are a structure (as illustrated in the diagrammatic perspective view of FIG. 4A) in which a bottom surface of a circular cone is perforated with a lot of jet pores 41, a structure (as illustrated in the diagrammatic perspective view of FIG. 4B) in which a pipelike member is perforated with a lot of jet pores 41 along the lengthwise direction, and a structure (as illustrated in the diagrammatic cross section of FIG. 4C) in which an opening 41 is provided and a restricting member 43 is located at a position opposed thereto so as to let the cleaning liquid impinge on the restricting member 43, thereby scattering the cleaning liquid. Although not shown, the jet pores 41 shown in FIG. 4B may be modified as a slit. Of course, any other shapes and structures than the above structures may be employed, and thus, there are no restrictions on the structure etc. of the shower heads insofar as cleaning of treated body can be effectively performed. In FIGS. 4A to 4C, an arrow represents the direction of flow of the cleaning liquid.

Upon cleaning, brushing may be carried out with a brush if necessary.

As described, the present invention makes a part of a waste liquid from a lower cleaning bath join a waste liquid from an at least one upper stage cleaning bath to use the mixture as a cleaning liquid for the above lower cleaning bath, thereby enabling to independently increase an amount of the cleaning liquid that can be used at a bath for first cleaning of the substrate, for example at the first bath. Accordingly, it becomes possible that pollutants of the types difficult to clean can be removed with efficiency at the first bath without changing the total amount of the cleaning liquid used.

Using the cleaning apparatus as described above, the present invention also is able to remove highly sticky contaminants, which were heretofore difficult to clean, for example deposits comprised of an etching paste or the like with a viscosity of not less than 10,000 mPa•s.

Further, in the present invention, the flow rate W of the cleaning liquid used for the lower cleaning bath is arranged as variable between the flow rate in cleaning mode 1 with only highly pure cleaning water, i.e., the flow rate V, and the flow rate in cleaning mode 2 with addition of a waste water from a lower cleaning bath, i.e., the flow rate $(V+V_1)$, so that the two types of cleaning modes can be selectively used. In this case, cleaning with higher cleanliness becomes possible, because cleaning can be carried out depending upon circumstances, as against the cases where the flow rate is fixed at $(V+V_1)$.

It is more preferred that a pollutant trap member such as a filter be interposed between a cleaning liquid bath and a pipe in order to remove the pollutant.

The moving means for moving the substrate as a treated body is not limited to the above-mentioned belt, but it may be a moving means using an arm. If it is a beltlike member, it is preferably formed as mesh.

The present invention can be applied to not only single treated bodies in a batch manner, but also a continuous body.

<Experiment>

Next, the cleaning apparatus shown in FIG. 2 was used to clean a stainless steel plate of 10 cm$^2$ on which a paste with a viscosity of 30,000 mPa•s was deposited as sticky pollutant.

As the new cleaning liquid pure water was supplied at a flow rate of V l/min from the shower head 108 corresponding to the third cleaning liquid bath 103. Thus, the cleaning liquid from the shower head 107 was also supplied at the flow rate of V l/min.

A jet spray time of the cleaning liquid from each shower head was 5 minutes.

A jet spray rate of the cleaning liquid jet-sprayed from the shower head 106 was determined for a mixture of the cleaning liquids between the flow rate of the secondary treatment liquid 112, V l/min, and the flow rate of the tertiary treatment liquid 115, $V_1$ l/min. Namely, the flow rate of the cleaning liquid jet-sprayed from the shower head 106 was $V+V_1$ l/min. Here, the flow rate was adjusted as $V>V_1$.

<Comparative Experiment>

The cleaning apparatus shown in FIG. 1 was used to clean a stainless steel plate of 10 cm$^2$ on which a paste with a viscosity of 30,000 mPa·s was deposited as sticky pollutant, similarly as in the above experiment.

Pure water was also used as the newly supplied cleaning liquid, similarly as in the above experiment, and the flow rate thereof was V l/min similarly as in the above experiment. Accordingly, the flow rate of the cleaning liquid jet-sprayed from each shower head was V l/min.

The other conditions were the same as those in the above experiment, including the shape of shower heads, the number, size, and layout of jet pores formed therein, and the distance between the shower heads and the stainless steel plate.

For comparison's sake, a removal effect of pollutant was checked for a case where the flow rate of the cleaning liquid used for first cleaning was set smaller than V.

Figure 5:
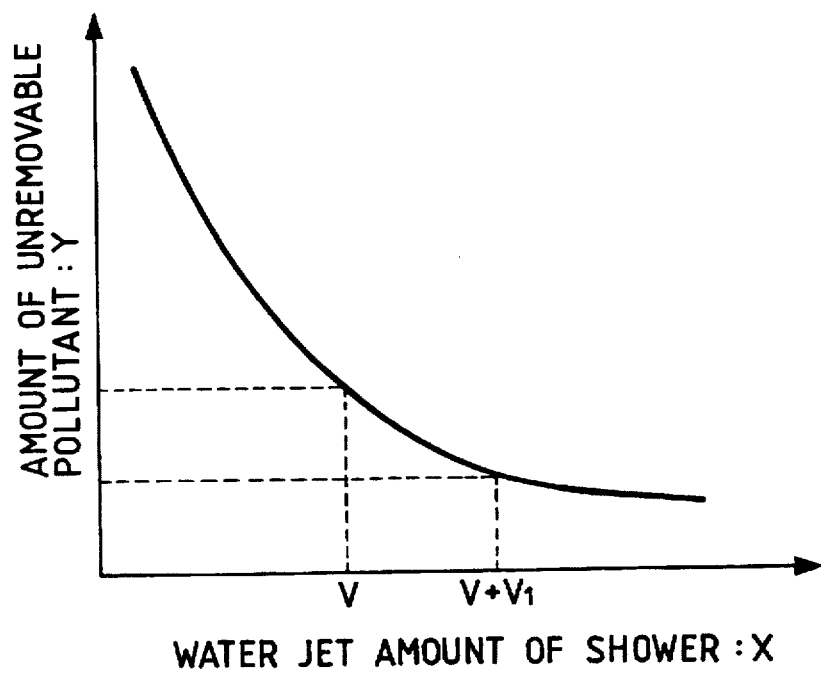
FIG. 5 is a graph to illustrate an example of amount of unremovable pollutant against water jet amount of cleaning liquid from shower.

FIG. 5 shows a relation between the amount of unremovable pollutant and the flow rate of cleaning liquid. The amount of unremovable pollutant Y was measured in the following manner.

A stainless steel substrate as a treated body after cleaned was fully dried, and a weight $y_1$ thereof was measured. In order to dissolve and remove the paste as unremoved pollutant on the substrate, the substrate after cleaned was next immersed in a 1:1 mixture solvent (temperature 60° C.) of xylene and IPA (isopropyl alcohol) for 10 minutes.

After immersed, the substrate was next fully dried, and a weight $y_2$ of the substrate was measured. A difference between the weights of the substrate before and after immersion, i.e. $y_1-y_2$, was defined as an amount of unremovable pollutant Y.

As seen from FIG. 5, the amount of unremovable pollutant Y tended to decrease with an increase of the water jet amount X from the shower head. However, it seemed that as to the sticky pollutant, the amount of unremovable pollutant Y had little relevance to the cleanliness of the cleaning water.

Namely, it was found that the sticky pollutant deposited on a substrate not cleaned at all was able to be removed more as the amount of cleaning water increased.

It was thus found out that the effect to remove the sticky pollutant from the substrate became higher when the water jet amount X of shower was set to (V+V$_1$) than when the water jet amount X of shower was set to V. Also, the sticky pollutant can be removed more easily with a higher pressure of the cleaning liquid on the substrate. A pollutant soluble to the cleaning liquid or a pollutant with less stickiness can also be effectively removed by increasing the water jet amount of shower.

It was thus confirmed that the total amount of supply water and waste water necessary in the experiment was the same as that in the comparative experiment. It was thus confirmed that the use of the path of cleaning water in the experiment was able to overcome the problems of increasing the supply demand, of pure water etc., increasing the disposal demand, and increasing the feed demand (pump capacity etc.) of cleaning water.

Accordingly, the sticky pollutant can be effectively removed without increasing the cost for the apparatus. As a consequence, it was confirmed that the present invention was able to provide the cleaning apparatus permitting a high-yield fabrication line as maintaining the cost for final products.

The flow rate of the cleaning liquid changes depending upon the shape of shower heads used, the size of substrates cleaned, the shape of substrates cleaned, a treatment number of cleaned substrates per unit time, and the cleanliness demanded. Specifically, for plate substrates, the flow rate V is preferably 2 to 20 l/min, more preferably about 5 to 10 l/min, and the above flow rate V$_1$ is preferably 2 to 20 l/min, more preferably about 5 to 20 l/min.

The number of cleaning stages n does not have to be 3 as in FIG. 2, but n may be more than 3 for necessary cleaning. However, n should be an integer not less than 2 in the present invention.

Further, it is preferred that preliminary washing be carried out before the above cleaning, using a low-grade cleaning liquid, for example such as tap water.

In addition, the above description concerned mixing the first-stage treatment liquid with the second-stage treatment liquid out of the three-stage cleaning liquids, but a mixture of the second-stage treatment liquid with the third-stage treatment liquid may be further used as the second-stage cleaning liquid if necessary.

In this manner, the present invention enables to remove pollutants of the types which were heretofore difficult to clean, such as highly sticky pollutants, and it is a matter of course that the invention demonstrates better effects to clean pollutants with low stickiness than the conventional methods.

The following description concerns examples where the semiconductor devices are solar cells.

EXAMPLE 1

In this example a relation was checked between the viscosity P of pollutant with stickiness and the amount Q of unremovable pollutant remaining on the substrate after cleaned. A change of the viscosity P was achieved by changing the viscosity of the etching paste 307 as detailed later. Also, an evaluation method of the amount of unremovable pollutant Q was the same as that for the amount of unremovable pollutant Y as obtained in the above experiment.

First described with FIGS. 6A to 6E is a method for producing a solar cell substrate cleaned and evaluated in this example.

Figure 6A:
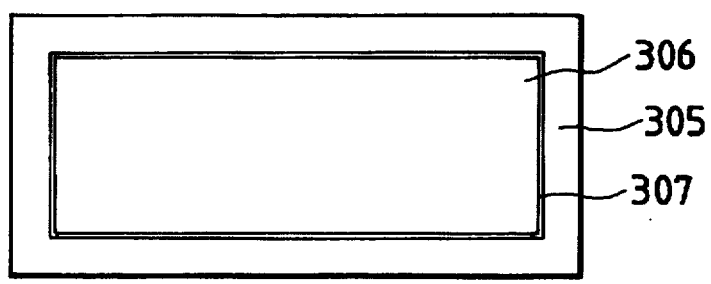
FIG. 6A is a diagrammatic plan view of an example in which an etching paste is laid on a solar cell substrate.
Figure 6B:
FIG. 6B is a diagrammatic cross section of FIG. 6A.
Figure 6C:
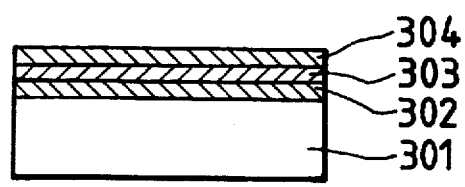
FIG. 6C is a diagrammatic cross section to illustrate an example of a lamination structure of a solar cell.
Figure 6D:
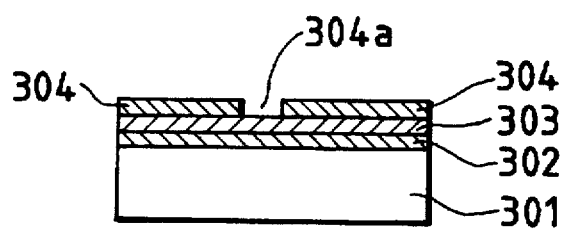
FIG. 6D is a diagrammatic cross section to illustrate an example in which a part of the solar cell shown in FIG. 6C is etched.

FIG. 6A is a diagrammatic plan view to show a state where the etching paste as detailed later is printed on a solar cell substrate, and FIG. 6B is a diagrammatic side view thereof. FIG. 6C is a diagrammatic cross section of the solar cell substrate shown in FIG. 6A and FIG. 6B.

The solar cell substrate of FIG. 6C was a structure obtained by forming a back reflective layer 302, a non-single-crystal silicon layer 303, and a transparent conductive layer 304 in order on a surface of base 301 comprised of stainless steel as a conductive material, by a film-forming method such as sputtering, CVD, etc. The stainless steel 301 had the thickness of 150 µm. The back reflective layer 302 was provided for reusing incident light, which was a laminate structure of aluminum-silicon of a conductive material and zinc oxide, and the thickness thereof was 1 µm. The non-single-crystal silicon layer 303 was a subject to generate a photoelectromotive force, which was a laminate structure of p-type semiconductor layer, i-type semiconductor layer, n-type semiconductor layer, p-type semiconductor layer, i-type semiconductor layer, and n-type semiconductor layer in order from the bottom, and the thickness thereof was 1 µm. The transparent conductive film 304 was provided for the purposes of anti-reflection and collection of electrons and was comprised of indium oxide herein, and the thickness thereof was 20 nm.

Now, the solar cell substrate 305 having the structure shown in FIG. 6C is used after cut in a size as needed. When the substrate was cut, short circuit has frequently occurred between the transparent conductive film 304 and the base 301 of the conductive material on the cut surface. This short circuit makes charges generated in the above non-single-crystal silicon layer 303 flow in the reverse direction or vanish, resulting in dropping the power generation efficiency of the above solar cell. Specifically speaking, the short-circuit resistance of the above solar cell decreases so as to fail to obtain a sufficient electromotive force. In order to prevent this short-circuit phenomenon, this example included a groove 304a formed by removing a part of the transparent conductive film 304, as conceptually shown in FIG. 6D, so as to form an independent generation area 306 as shown in FIG. 6E.

Figure 6E:
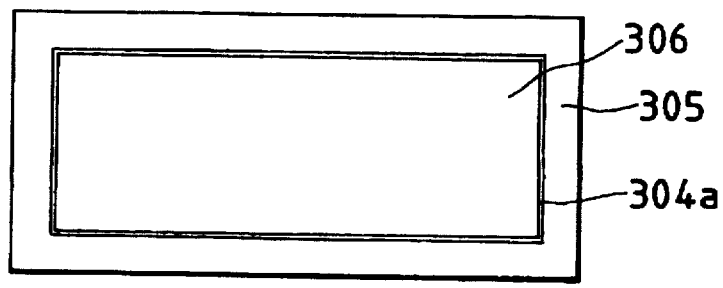
FIG. 6E is a diagrammatic plan view of a solar cell substrate completed.

Specifically, the surface of the solar cell substrate 305 was coated with the etching paste 307 including $FeCl_3$, $AlCl_3$, etc. by the method of screen printing, etc., the coated substrate was then heated, and the above etching paste 307 was finally removed and cleaned to obtain the substrate in the state shown in FIG. 6E. For the use in screen printing as described above, the etching paste 307 was provided with a viscosity of not less than 10,000 mPa·s by adding a filler, a thickening agent, etc. to the above substance including $FeCl_3$, $AlCl_3$, etc.

In this example, the viscosity of the etching paste 307 was changed in the range of 600 to 46,000 mPa·s to check an amount of unremovable pollutant remaining on the solar cell substrate after cleaned.

FIG. 13 is a diagrammatic structural drawing to schematically illustrate a producing apparatus for producing the solar cell substrate in the present example. This apparatus was comprised of three steps of printing, drying, and cleaning, and carrying conveyors for moving the solar cell substrate were provided between the steps.

The printing step is a step of using a printing apparatus 403 to form the above etching paste 307 in a desired pattern on the surface of the solar cell substrate 305 by a squeegee 410, using a screen 401.

The drying step is a step of using an IR type tunnel drying furnace 405 to heat the solar cell substrate 305 after printed, at 150° C. for one minute by an IR heater installed inside the drying furnace 405. This heat treatment removed only the part coated with the above etching paste 307 from the transparent conductive film 304 of the substrate surface.

The cleaning step is a step of, after cooling the solar cell substrate 305 after down to the ordinary temperature, cleaning to remove the etching paste 307, using the cleaning apparatus 407 shown in FIG. 2. This cleaning apparatus 407 was one comprised of multiple baths connected in cascade connection, in which the first stage was arranged to make a part of waste water from the first cleaning liquid bath 101 join the waste water from the second cleaning liquid bath 102 to supply a strong jet flow, thereby removing the etching paste 307 from the surface of substrate 305. On this occasion, the rate of the cleaning water jet-sprayed from the first shower head 106 was set to (V+V₁) of 20 l/min. At and after the second stage, the substrate surface was properly cleaned at the flow rate of 7 l/min of cleaning water gradually becoming cleaner, finally obtaining a clean surface having almost zero removable pollutant. Finally, the solar cell substrate 305 after cleaned was subjected to a hydro-extracting treatment with hot air knife 408.

Since the next step and steps after the next step are not directly related to this example, the detailed description thereof is omitted herein, but briefly described, the following steps are for forming electrodes for collecting electrons in the power generation area separated in the above steps.

COMPARATIVE EXAMPLE 1

As a comparative example, the substrate was cleaned with the cleaning liquid of the secondary treatment liquid from the second cleaning liquid bath 102 but without using the tertiary treatment liquid from the first cleaning liquid bath 101, while the cleaning liquid was jet-sprayed at the flow rate of 7 l/min from the first shower head 106. Namely, the amount of the cleaning liquid jet-sprayed from the first shower head 106 was set to be the same as the amount of waste liquid from the second cleaning liquid bath 102 one step upper. The other points were the same as those in Example 1.

Figure 7:
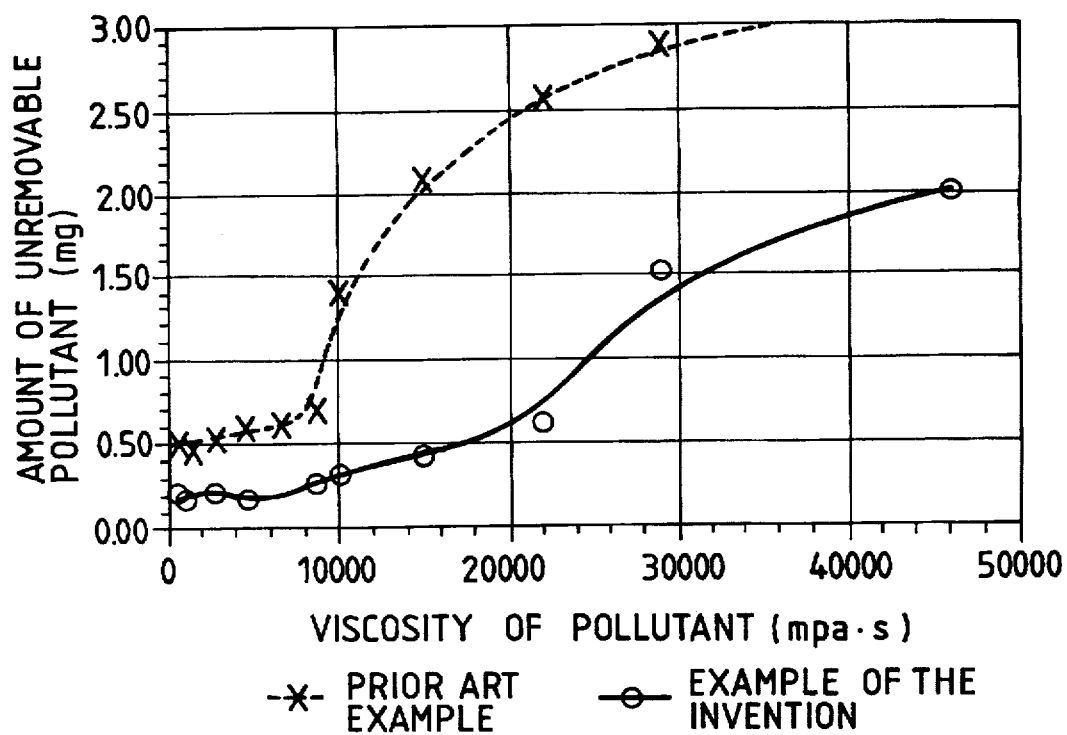
FIG. 7 is a drawing to illustrate a change of amount of unremovable pollutant against viscosity of pollutant.

FIG. 7 shows results of evaluation of relations between the viscosity of sticky pollutant, i.e., the viscosity P of the etching paste 307, and the amount of unremovable pollutant Q remaining on the surface of the solar cell substrate 305 produced as described above. The evaluation results can be summarized as follows.

(1) The amount of unremovable pollutant Q in Example 1 is smaller throughout the entire viscosity range than that in Comparative Example 1. Namely, it was confirmed that the surface of the solar cell substrate 305 in Example 1 was cleaner.

(2) It was confirmed that the amount of unremovable pollutant in Example 1 was far smaller than that in Comparative Example 1 particularly in the range where the viscosity P of the etching paste 307 was not less than 10,000 mPa·s.

It can be thus said that the surface of the solar cell substrate 305 can be made clearer by the cleaning apparatus of the present invention. Since the viscosity P of the etching paste 307 can be relatively freely selected, etching pastes with particularly high viscosities can be used, which enabled to achieve finer etching lines, that is, finer and clearer patterns.

EXAMPLE 2

In this example, a substrate α, in which a collector electrode was formed on the surface of the solar cell substrate after completion of cleaning and hydro-extraction with air knife as in Example 1, was again cleaned, and an amount of unremovable pollutant R remaining on the surface of the substrate a was evaluated.

Figure 8A:
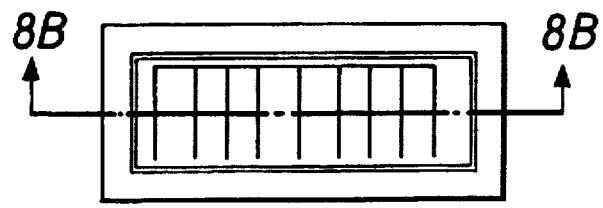
FIG. 8A and FIG. 10A are diagrammatic plan views to show preferred examples of solar cells.
Figure 8B:
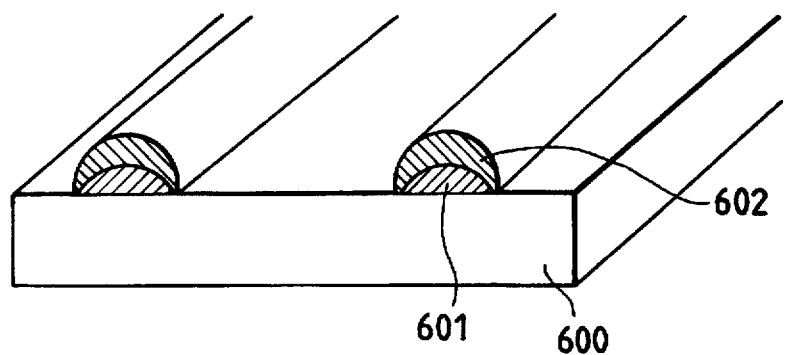
FIG. 8B and FIG. 10B are diagrammatic perspective views, partly in section, of the solar cells shown in FIG. 8A and FIG. 10A, respectively.

FIG. 8A and FIG. 8B are schematic drawings to show the structure of the collector electrode, wherein FIG. 8A is a diagrammatic plan view thereof and FIG. 8B a diagrammatic perspective view. In the drawings, reference numeral 600 designates the solar cell substrate, 601 a copper paste, 602 a solder, and 604 a soldering paste.

FIG. 9A to FIG. 9D are schematic step diagrams to illustrate steps for forming the collector electrode in the structure shown in FIG. 8A and FIG. 8B.

Figure 9A:
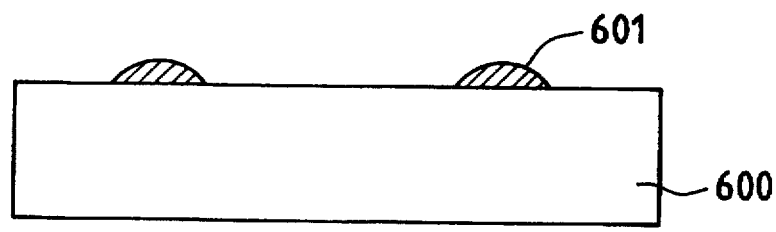
FIGS. 9A to 9D and FIGS. 11A to 11D are step diagrams to show diagrammatic cross sections for illustrating respective examples of formation of collector electrodes.

(1) The copper paste 601 was screen-printed in width of 150 μm and at pitch of 5 mm on an effective surface of the solar cell substrate 600, and was hardened at 150 ° C. in an IR drying furnace. (FIG. 9A)

Figure 9B:
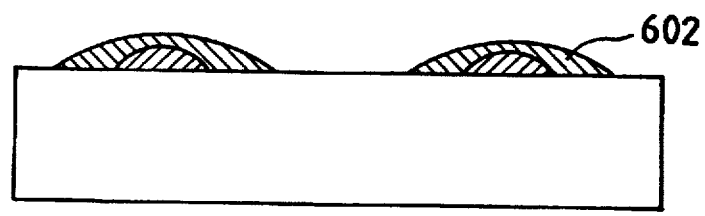

(2) The soldering paste 602 was screen-printed in width of 400 μm and at pitch of 5 mm so as to fully cover the copper paste 601 in the above step (1). (FIG. 9B)

(3) The substrate in the above step (2) was heated at 300° C. in an IR hardening furnace. When the solder was melted in the IR hardening furnace, the transparent conductive film (not shown) of the outermost surface of the solar cell substrate 600 repelled the soldering paste 602, so that the soldering paste 602 was automatically self-aligned on the copper paste 601 to form the collector electrode of solder coated copper in width of 150 µm. (FIG. 9C)

(4) Further, the substrate in the above step (3) was cleaned to remove flux 603, using the cleaning apparatus shown in FIG. 2. (FIG. 9D)

The water jet amount of the cleaning liquid from the first shower head, that is, the rate of cleaning liquid in the first stage was $(V+V_1)$ of 20 l/min.

Figure 9C:
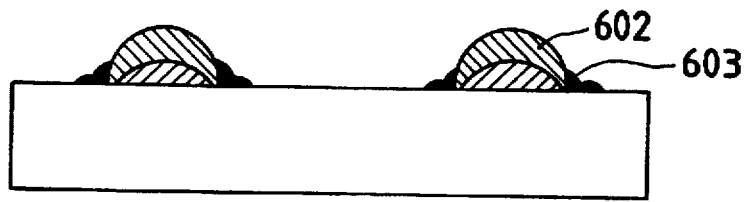
Figure 9D:
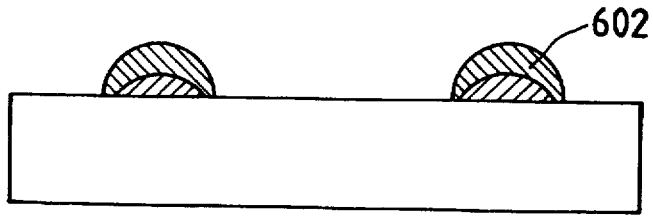

A purpose of this cleaning is to remove the flux 603 of solder formed on the both sides of the copper paste 601 present on the substrate 600, as shown in FIG. 9C. Since this flux 603 is acid, it could adversely affect devices in the future. Thus, it must be removed completely. The flow rate of the cleaning liquid in and after the second stage was 5 l/min.

COMPARATIVE EXAMPLE 2

As a comparative example, only the waste water of cleaning in the second stage was used as the cleaning liquid jet-sprayed from the first shower head, and the rate of the cleaning liquid was 5 l/min. The other points were the same as those in example 2.

The amount of unremovable pollutant R remaining on the surface was checked using the substrate 600 formed in the above-stated manner. The above flux was cleanly removed without trace in Example 2, whereas the flux was not perfectly removed so as to leave trace in Comparative Example 2, failing to achieve a satisfactory result in respect of appearance as well.

It was thus confirmed that the cleaning apparatus of the present invention was effective to remove sticky pollutant including the etching paste or the like and was also able to remove the soldering flux.

EXAMPLE 3

Figure 10A:
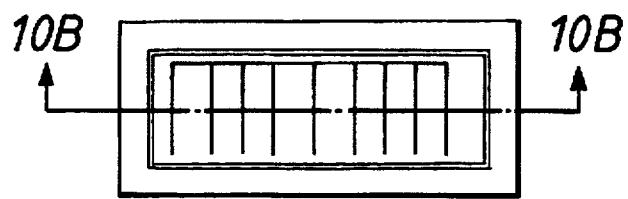
Figure 10B:
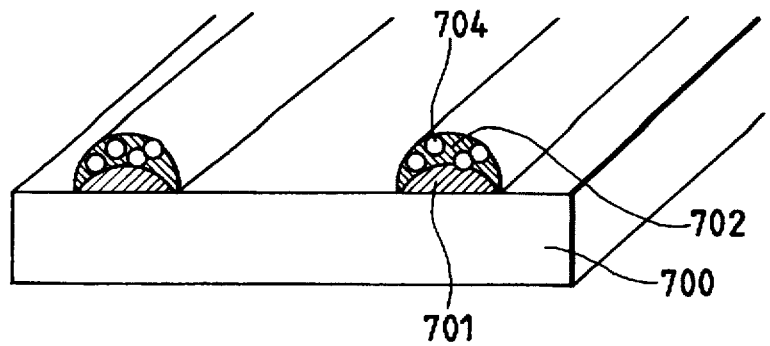

In this example, another soldering paste, in which silver particles in particle size of 1 µm were mixed in proportion of 10 wt %, was used in place of the soldering paste in Example 2, and a substrate was obtained by forming the collector electrode on the surface of the solar cell substrate. FIG. 10A and FIG. 10B are schematic drawings to illustrate the structure of the above collector electrode, wherein FIG. 10A is a diagrammatic plan view and FIG. 10B a diagrammatic perspective view. In the drawings, reference numeral 700 designates a solar cell substrate, 701 a copper paste, 702 a solder, 703 a flux, 704 silver particles, and 705 a soldering paste.

FIG. 11A to FIG. 11D are schematic step diagrams to illustrate steps for forming the collector electrode in the structure shown in FIG. 10A and FIG. 10B.

Figure 11A:
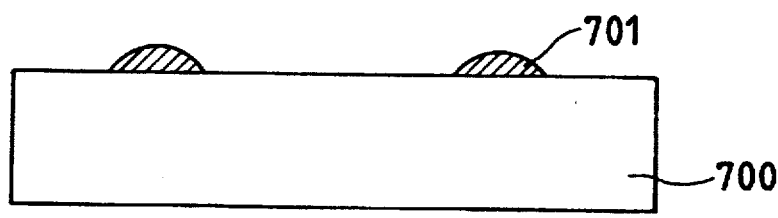
Figure 11B:
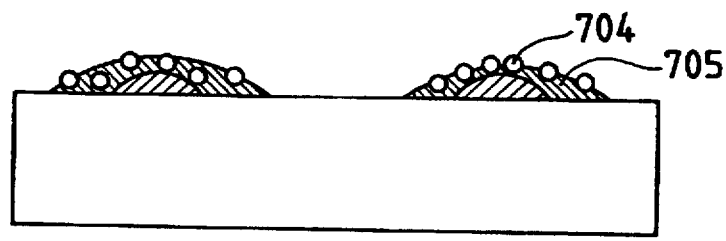
Figure 11C:
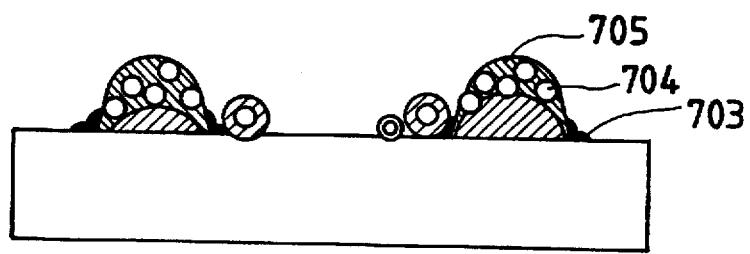
Figure 11D:
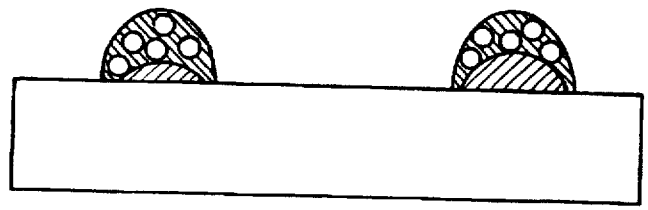

Also in the present example, similarly as in Example 2, the copper paste 701 was printed and hardened on the substrate 700 (FIG. 11A), and then the soldering paste 705 containing dispersed silver particles 704 was screen-printed on the copper paste 701 thus hardened (FIG. 11B). Subsequently, the substrate was heated in the IR hardening furnace to melt the solder and thereafter to harden (FIG. 11C). Then the substrate 700 lowered to the ordinary temperature was cleaned using the cleaning apparatus shown in FIG. 2 to remove the flux 703 or the like remaining on the surface of substrate 700 at the previous steps (FIG. 11D).

In the present example, the substrate after completion of the above cleaning step was again cleaned, and then the amount of unremovable pollutant S remaining on the surface of the substrate was evaluated. Here, a reason of incorporating the silver particles 704 into the soldering paste 705 is to thicken the solder layer. When the solder layer is thickened, a cross section for an electric current to pass increases, thereby decreasing current losses due to resistance.

The other points were the same as those in Example 2.

For example, the rate of the cleaning liquid jet-sprayed from the first stage shower head in the cleaning apparatus was set to the same rate, 20 l/min, as in Example 2. Also, the rate of cleaning liquid in and after the second stage was 6 l/min. Purposes of cleaning in the present example are to remove the flux 703 of solder formed on the both sides of the copper paste 701 present on the surface of the solar cell substrate 700 and to remove the silver particles 704 irregularly scattered on the transparent conductive layer (not shown) of the outermost surface of the solar cell substrate 700. Since this flux 703 is acid, it could adversely affect the devices in future. Thus, it must be completely removed by cleaning. Further, the silver particles 704 have a possibility of causing shunt due to migration of silver ions to grow in the semiconductor layer. Thus, the silver particles scattered must be perfectly removed by cleaning.

COMPARATIVE EXAMPLE 3

The rate of the cleaning liquid jet-sprayed from the first-stage shower head was set to 6 l/min, which was the same as in and after the second stage. Further, the cleaning liquid jet-sprayed from the first-stage shower head was only the waste water (secondary treatment liquid) from the second stage bath one stage upper. The other points were the same as in Example 3.

For the substrates formed in the above manner, the amount of unremovable pollutant S remaining on the surface was checked. In Example 3, the flux was cleaned without trace and the silver particles scattered over the transparent conductive film were also removed. Comparative Example 3, however, failed to perfectly remove the flux and silver particles, and also failed to achieve a satisfactory result in respect of appearance.

It was thus confirmed that the cleaning apparatus of the present invention was effective to remove sticky pollutant consisting of the etching paste etc. and was able to remove the flux of solder and silver particles scattered over the transparent conductive film.

EXAMPLE 4

In this example, the rate of the cleaning liquid jet-sprayed from the first-stage shower head was changed at least once between V (=7 l/min) and $(V+V_1)$ (=20 l/min), instead of the fixed rate of the cleaning liquid jet-sprayed from the first-stage shower head at $(V+V_1)$ (=20 l/min) in Example 1. The other points were the same as in Example 1.

Figure 12:
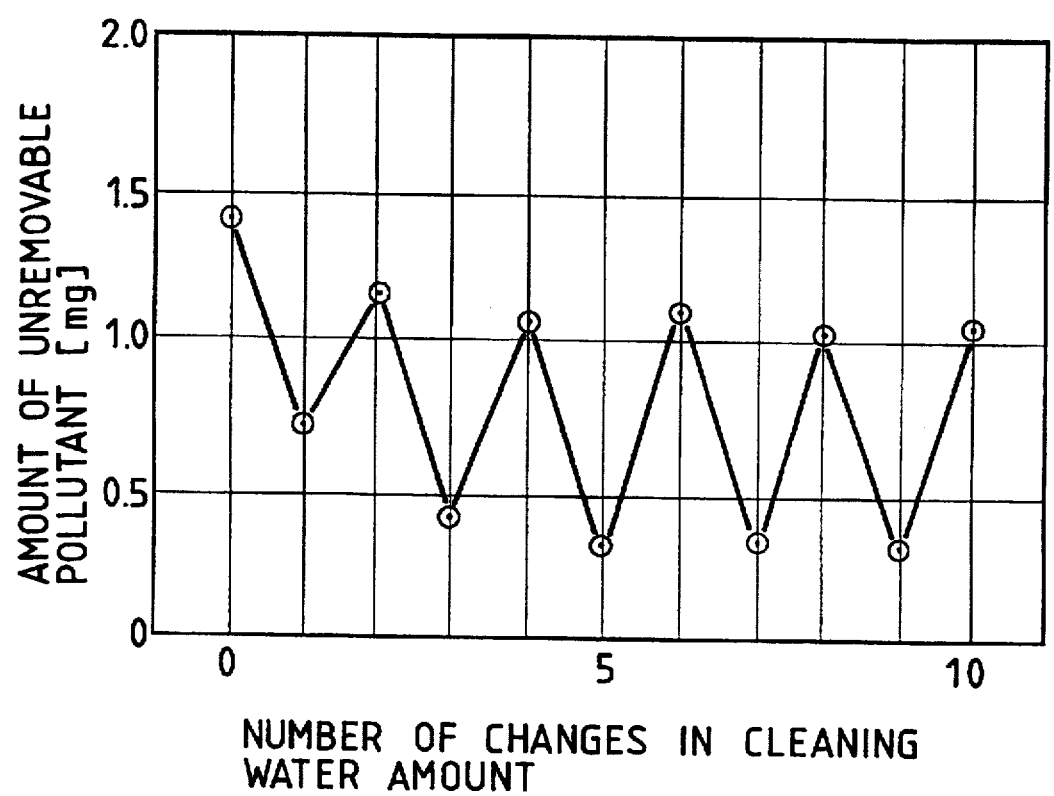
FIG. 12 is a drawing to illustrate a change of amount of unremovable pollutant against change of amount of cleaning water in the first stage.

FIG. 12 is a graph to show a relation between the number of changes in amount of cleaning water jet-sprayed from the first shower within a cleaning time of five minutes and the cleanliness of substrate. Here, the rate of the cleaning liquid jet-sprayed from the first shower was first set at $(V+V_1)$ (=20 l/min).

This example demonstrated that the cleanliness of substrate was able to be further improved by changing the rate of the cleaning liquid jet-sprayed from the first-stage shower head at least once. In particular, it was confirmed that higher cleanliness was able to be achieved by setting the number of changes to an odd number, that is, by setting the rate of the cleaning liquid jet-sprayed from the first-stage shower head to V (=7 1/min) finally or immediately before moving to the second stage. Namely, it is understood that to decrease the rate of the cleaning liquid before the substrate moves to the next stage is effective for achieving higher cleanliness.

EXAMPLE 5

In this example, a solar cell substrate was immersed in an electrolyte to be electrochemically treated so as to eliminate defects present in the solar cell substrate and thereafter was cleaned, and then an amount of unremovable pollutant remaining on the surface of substrate was evaluated.

The solar cell substrate similar to that in Example 1 was put in an electrolytic apparatus containing an aluminum chloride solution not shown, and a forward voltage was applied to treat the defects.

Next, cleaning was carried out in the same manner as in Example 1. After cleaning, the substrate was subjected to hydro-extraction with air knife and then was dried in a hot air drying furnace not shown.

The substrate after completion of cleaning and drying was put into an ultrasonic cleaning apparatus containing pure water not shown, and conductivities of liquids inside the ultrasonic apparatus before and after cleaning were compared. There was no change observed.

This example confirmed that high cleanliness could be achieved by the present invention in cleaning of liquid with low stickiness as well.

As described above, the present invention provides the cleaning apparatus and cleaning method that can be operated at low cost and depending upon a degree of contamination on the substrate.

Further, the present invention provides the cleaning apparatus and cleaning method that can effectively remove pollutant with high stickiness.

In addition, the present invention provides the cleaning apparatus and cleaning method that can also perform higher-cleanliness cleaning as well as removing the pollutant with high stickiness.

It is noted that the present invention is by no means limited to the above method for producing the solar cell substrate, but can be generally applied to cleaning steps including those necessitating batch cleaning. Particularly, the present invention is effective for cleaning steps for removing sticky pollutant from substrate.

Although the present invention was described assuming the cleaning apparatus comprised of three baths, the invention can also be applied of course to cleaning apparatus having a plurality of cleaning liquid baths, as described previously.

Further, although the present invention was described assuming the cleaning system with water-base cleaning liquids, the invention can also be applied to cleaning systems with non-water base cleaning liquids (for example solvents such as acetone or alcohol).

It is needless to mention that the present invention can be modified with necessity within the scope of the essence of the present invention.

What is claimed is:

1. A cleaning method for cleaning a treated body successively in each of a plurality of cleaning stages, comprising the steps of:

supplying into a cleaning liquid supply line a cleaning liquid used for cleaning in a first cleaning stage and a cleaning liquid used for cleaning in a second cleaning stage subsequent to said first cleaning stage to continually mix the used cleaning liquids to form a mixed cleaning liquid, the mixing being carried out prior to effecting cleaning in said first cleaning stage; and cleaning said treated body with the mixed cleaning liquid in said first cleaning stage at a flow rate greater than that of the cleaning liquid used for cleaning in said subsequent second cleaning stage.

2. The cleaning method according to claim 1, wherein said flow rate of the cleaning liquid in said first cleaning stage is changed at least once during cleaning in said first cleaning stage.

3. The cleaning method according to claim 2, wherein said flow rate of said first cleaning stage is changed to a flow rate of the cleaning liquid used for cleaning in said subsequent second cleaning stage immediately before the completion of cleaning in said first cleaning stage.

4. The cleaning method according to claim 1, wherein the cleaning liquid in said first cleaning stage is provided exclusively from the cleaning liquid used for cleaning in said subsequent second cleaning stage immediately before the completion of cleaning in said first cleaning stage.

5. The cleaning method according to claim 1, wherein a substance to be cleaned from said treated body has a viscosity of not less than 10,000 mPa•s.

6. The cleaning method according to claim 5, wherein the substance comprises one of an etching paste and a flux.

7. The cleaning method according to claim 1, wherein the treated body is a semiconductor device.

8. The cleaning method according to claim 7, wherein the semiconductor device comprises a solar cell substrate.

9. A cleaning method for cleaning a treated body comprising the steps of:

providing first storing means for storing one cleaning liquid used in a first stage and second storing means for storing another cleaning liquid used in a second stage;

combining the cleaning liquids provided through a first line and a second line connected to said first and said second storing means, respectively, into a supply line to be mixed with each other, whereby the total amounts of the cleaning liquids provided through said first and second lines are used as a cleaning liquid in said first stage; and cleaning the treated body while allowing the treated body to pass, in order, through said first stage and then said second stage.

10. The cleaning method according to claim 9, further comprising a step of changing a mixing ratio of the first and the second cleaning liquids.

11. The cleaning method according to claim 9, wherein said step of combining the mixed cleaning liquid of the first and the second cleaning liquids for use in said first stage is effected by pumping the first and the second cleaning liquids at a position provided downstream of a mixing portion.

12. The cleaning method according to claim 9, wherein said step of combining the mixed cleaning liquid of the first and the second cleaning liquids for use in said first stage is effected by pumping the first and the second cleaning liquids at a position upstream of a mixing portion.

13. The cleaning method according to claim 9, wherein said step of cleaning in said first stage is performed with the cleaning liquid being supplied at a flow rate greater than a flow rate of an unmixed cleaning liquid supplied for cleaning in said second stage.

14. The cleaning method according to claim 9, wherein the cleaning liquids from said first and second lines are continually supplied to said supply line to be mixed with each other.

15. The cleaning method according to claim 9, wherein said step of combining the cleaning liquids into said supply line is effected by connecting said first and second lines to said supply line.

16. The cleaning method according to claim 15, wherein said step of connecting said first, second, and supply lines is effected by a three-way joint.

17. The cleaning method according to claim 15, wherein said step of connecting said first, second and supply lines is effected by a valve.

18. The cleaning method according to claim 15, further comprising a step of varying a flow resistance of said first line and a flow resistance of said second line at their respective points of connection to said supply line.

* * * * *

UNITED STATES PATENT AND TRADEMARK OFFICE
CERTIFICATE OF CORRECTION

PATENT NO. : 5,894,853

DATED : April 20, 1999

INVENTOR(S): TATSUO FUJISAKI, ET AL.

It is certified that error appears in the above-identified patent and that said Letters Patent is hereby corrected as shown below:

COLUMN 1,
Line 28, "and" should read --an--.

COLUMN 2,
Line 41, "capacity (pump demand" should read --demand (pump capacity--.

COLUMN 4,
Line 14, "a" should be deleted.

COLUMN 7,
Line 57, "demand," should read --demand--.

COLUMN 10,
Line 48, "a" should read --$\alpha$--.

UNITED STATES PATENT AND TRADEMARK OFFICE
CERTIFICATE OF CORRECTION

PATENT NO. : 5,894,853

DATED : April 20, 1999

INVENTOR(S): TATSUO FUJISAKI, ET AL.

Page 2 of 2

It is certified that error appears in the above-identified patent and that said Letters Patent is hereby corrected as shown below:

<u>COLUMN 11</u>,
Line 27, "example 2." should read --Example 2.--.

Signed and Sealed this

Twenty-third Day of May, 2000

Attest:

Q. TODD DICKINSON

*Attesting Officer*  *Director of Patents and Trademarks*